(12) United States Patent
Huang et al.

(10) Patent No.: US 9,978,926 B2
(45) Date of Patent: May 22, 2018

(54) THERMAL RADIATION MICROSENSOR COMPRISING THERMOELECTRIC MICRO PILLARS

(71) Applicant: The Hong Kong University of Science and Technology, Kowloon (HK)

(72) Inventors: Baoling Huang, Kowloon (HK); Peng Zhang, Shenzhen (CN); Dezhao Li, Kowloon (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days. days.

(21) Appl. No.: 15/136,220

(22) Filed: Apr. 22, 2016

(65) Prior Publication Data

US 2016/0336502 A1    Nov. 17, 2016

Related U.S. Application Data

(60) Provisional application No. 62/179,631, filed on May 14, 2015.

(51) Int. Cl.
| | | |
|---|---|---|
| *H01L 31/058* | (2006.01) | |
| *H01L 35/32* | (2006.01) | |
| *G01J 5/12* | (2006.01) | |
| *G01J 5/02* | (2006.01) | |
| *G01J 5/08* | (2006.01) | |

(52) U.S. Cl.
CPC .......... *H01L 35/325* (2013.01); *G01J 5/024* (2013.01); *G01J 5/0853* (2013.01); *G01J 5/12* (2013.01)

(58) Field of Classification Search
CPC ......... H01L 35/04–35/10; H01L 35/12–35/26; H01L 35/30; H01L 35/32–35/325; H01L 37/00–37/04; H01L 35/00–35/34

USPC .......................................... 257/470
See application file for complete search history.

(56) References Cited

U.S. PATENT DOCUMENTS

| | | |
|---|---|---|
| 6,335,478 B1 | 1/2002 | Chou et al. |
| 7,723,606 B2 | 5/2010 | Fiorini et al. |
| 2004/0188066 A1 | 9/2004 | Upadhya et al. |

(Continued)

FOREIGN PATENT DOCUMENTS

| | | |
|---|---|---|
| CN | 103512914 A | 1/2014 |
| EP | 2317577 A2 | 5/2011 |

(Continued)

OTHER PUBLICATIONS

Ahire, "Night Vision System in BMW", International Review of Applied Engineering Research, 2014, pp. 1-10, vol. 4, No. 1, Research India Publications.

(Continued)

*Primary Examiner* — Julio J Maldonado
*Assistant Examiner* — Stanetta Isaac
(74) *Attorney, Agent, or Firm* — Amin, Turocy & Watson, LLP (57) ABSTRACT

A thermal radiation microsensor can comprise thermoelectric micro pillars, in which multiple vertically standing thermoelectric micro pillars can act as thermoelectric pairs and mechanical support of an absorption layer. Radiation absorbed by the absorption layer can produce a temperature difference, which drives the thermocouple comprising p-type and n-type micro pillars to output a voltage. Multiple thermocouples can be connected in series to improve the signal output.

23 Claims, 11 Drawing Sheets

(56) References Cited

U.S. PATENT DOCUMENTS

| | | | |
|---|---|---|---|
| 2006/0000502 A1* | 1/2006 | Fiorini | H01L 35/34 136/224 |
| 2010/0031992 A1* | 2/2010 | Hsu | H01L 35/32 136/223 |
| 2012/0061569 A1 | 3/2012 | Noguchi | |
| 2014/0326883 A1 | 11/2014 | Abdolvand et al. | |
| 2015/0048249 A1 | 2/2015 | Hedler et al. | |
| 2015/0349022 A1* | 12/2015 | Edwards | H01L 27/16 257/252 |

FOREIGN PATENT DOCUMENTS

| | | |
|---|---|---|
| KR | 101507362 B1 | 3/2015 |
| WO | 2006122529 A2 | 11/2006 |
| WO | 2013127114 A1 | 9/2013 |

OTHER PUBLICATIONS

Zhao, et al., "Optomechanical Uncooled Infrared Imaging System: Design, Microfabrication, and Performance," Journal of Microelectromechanical Systems, Apr. 2002, pp. 136-146, vol. 11, No. 2, IEEE.

Tanaka, et al., "Thermopile Infrared Array Sensor for Human Detector Application," Journal of Microelectromechanical Systems, 2014, pp. 1213-1216, IEEE.

Gao, et al., "Self-powered flexible and transparent photovoltaic detectors based on CdSe nanobelt/graphene Schottky junctions," The Royal Society of Chemistry, Nanoscale, 2013, pp. 5576-5581, vol. 5.

Mizrahi, et al., "Large-format 17μm high-end VOx μ-bolometer Infrared Detector," Proceedings of SPIE, 2014, vol. 8704, 8 pages. Retrieved from http://proceedings.spiedigitallibrary.org/ on Jun. 12, 2013.

Oishi, et al., "SiO2/SiN Infrared Absorbing Film for uncooled Pyroelectric Sensor and its Fabrication and Evaluation," Joint UFFC, EFTF and PFM Symposium, 2013, pp. 329-331, IEEE.

Hirota, et al., "120×90 element thermoelectric infrared focal plane array with precisely patterned Au-black absorber," Sensors and Actuators A, 2007, pp. 146-151, vol. 135, Elsevier.

Boutchich, et al., "Package-free infrared micro sensor using polysilicon thermopile," Sensors and Actuators A, 2005, pp. 52-58, vol. 121, No. 1, Elsevier.

Peng, et al., "High-Performance Silicon Nanohole Solar Cells," Journal of the American Chemical Society, 2010, pp. 5872-6873, vol. 132, No. 20.

Xu, et al., "Micromachined Thermopile IR Detector Module with High Performance," IEEE Photonics Technology Letters, Feb. 2011, pp. 149-151, vol. 23, No. 3, IEEE.

Ishikawa, et al., "Performance of 320 x 240 Uncooled IRFPA with SOI Diode Detectors," Proceedings of SPIE, Infrared Technology and Applications, 2000, pp. 152-159, vol. 4130.

Erhardt, et al., "Silicon Cylindrical Lens Arrays for Improved Photoresponse in Focal Plane Arrays," Proceedings of SPIE, State-of-the-Art Imaging Arrays and Their Applications, 1984, pp. 165-172, vol. 501.

Ohira, et al., "Micro Mirror Arrays for Improved Sensitivity of thermopile Infrared Sensors," IEEE MEMS, Jan. 2011, pp. 708-711, IEEE.

Sion, et al., "Unpackaged infrared thermoelectric microsensor realised on suspended membrane by silicon technology," Sensors and Actuators A: Physical, 2012, pp. 78-86, vol. 175, Elsevier.

Randjelovic, et al, "Intelligent thermal vacuum sensors based on multipurpose thermopile MEMS chips," Vacuum, 2014, pp. 118-124, vol. 101, Elsevier.

Chen, et al "Fabrication of three dimensional split ring resonators by stress-driven assembly method," Optics Express, 2012, pp. 9415-9420, vol. 20, No. 9, Optical Society of America.

Voelklein, "Thermal-Based Microsensors," MEMS: Design, Analysis, and Applications, 2006, pp. 229-279, Springer.

Oh, et al., "Fabrication of piezoelectric P(VDF-TrFE) microcantilevers by wafer-level surface micromachining," Journal of Micromechanics and Microengineering, 2013, vol. 23, No. 9, IOP Publishing Ltd, 11 pages.

Pennelli, "Review of Nanostructured Devices for Thermoelectric Applications," Beilstein Journal of Nanotechnology, 2014, vol. 5, pp. 1268-1284.

Ihring, et al., "Surface-Micromachined Thermoelectric Infrared Focal-Plane Array with High Detectivity for Room Temperature Operation," Microelectronic Engineering, 2011, pp. 2267-2271, vol. 88, No. 8, Elsevier Science Ltd.

"Thermal Sensor for DDR3 Memory Modules to Expand Cloud Computing Portfolio," May 2011, Integrated Device Technology, Inc., 2 pages. Retrieved at http://www.idt.com/about/press-room/idt-introduces-thermal-sensor-ddr3-memory-modules-expand-cloud-computing-portfolio on Aug. 3, 2016.

"High Sensitivity Thermal Laser Sensors—300fW to 12W," Laser Thermal Power Sensors, 2016, Ophir Optronics Solutions Ltd, 3 pages. Retrieved at http://www.ophiropt.com/laser-measurement/laser-power-energy-meters/products/Laser-Thermal-Power-Sensors/High-Sensitivity-Thermal-Laser-Sensors on Aug. 3, 2016.

"Infrared Thermopile Contactless Temperature Sensor in WCSP Package," TMP006 | IR Thermopile Temperature Sensors, Texas Instruments, 2 pages. Retrived at http://www.ti.com/product/tmp006 on Aug. 3, 2016.

"Thermopile Infrared Detectors, Sensors & Array Modules," 2015, Excelitas Technologies Corp., 2 pages. Retrived at http://www.excelitas.com/Pages/Product/Thermopile-Detectors-Sensors-and-Array-Modules.aspx on Aug. 3, 2016.

"Thermopile Arrays and Imaging," Heimann Sensor, 3 pages. Retrieved at http://www.heimannsensor.com/products_imaging.php on Aug. 3, 2016.

"Infrared Detector Technology & Market Trends 2015," Oct. 2015, 4 pages. Retrieved at http://www.i-micronews.com/component/hikashop/product/infrared-detector-technology-market-trends-2015.html?Itemid=0 on Aug. 3, 2016.

Rogalski, et al., "Infrared Devices and Techniques (Revision)," Metrology and Measurement Systems, 2014, pp. 565-618, vol. 21, No. 4.

Rogalski, "Progress in Focal Plane Array Technologies," Progress in Quantum Electronics, 2012, pp. 342-473, vol. 36, Elsevier Ltd.

Lu, et al., "Enhanced in-plane thermoelectric figure of merit in p-type SiGe thin films by nanograin boundaries," The Royal Society of Chemistry, Nanoscale, 2015, pp, 7331-7339, vol. 7, No. 16.

Goodson, "Measurement of the Thermal Conductivity and Heat Capacity of Freestanding Shape Memory Thin Films Using the 3ω Method," Journal of Heat Transfer, Oct. 2008, vol. 130, No. 10, ASME, 7 pages.

Hippalgaonkar, et al., "Fabrication of Microdevices with Integrated Nanowires for Investigating Low-Dimensional Phonon Transport," Nano Letters, 2010, pp. 4341-4348, vol. 10, No. 11, American Chemical Society.

Yajima, et al., "Fabrication of Self-Supporting Polysilicon Thermopile," Proceedings of 2000 International Symposium on Micromechatronics and Human Science, 2000, pp. 237-241, IEEE.

Liu, et al., "Current progress and future challenges in thermoelectric power generation: From materials to devices," Acta Materialia, 2015, pp. 357-376, vol. 87, Elsevier.

Sarro, et al, "Silicon Cantilever Beams Fabricated by Electrochemically Controlled Etching for Sensor Applications," J. Electrochem. Soc.: Solid-State Science and Technology, Aug. 1986, pp. 1724-1729, vol. 133, No. 8.

* cited by examiner

THERMAL RADIATION MICROSENSOR COMPRISING THERMOELECTRIC MICRO PILLARS

CROSS-REFERENCE TO RELATED APPLICATIONS

The present application claims the benefit of priority to U.S. Provisional Patent Application No. 62/179,631, filed May 14, 2015, and entitled "Thermal Radiation Microsensor Based on Thermoelectric Micro Pillars," the entirety of which application is hereby incorporated herein by reference.

TECHNICAL FIELD

This disclosure relates generally to a vertical design and fabrications of a thermoelectric thermal radiation microsensor for numerous applications. More specifically, this disclosure relates to thermal radiation microsensors comprising suspended support layers, heat-generating layer and isolated free-standing thermoelectric pillars.

BACKGROUND

Thermal radiation is electromagnetic radiation generated by the thermal motion of charged particles in matter of a temperature above 0 K. Thermal radiation represents a conversion thermal energy into electromagnetic energy and can be classified into infrared radiation, visible light and ultraviolet light according to the radiation wavelength or frequency. All matter with a temperature above 0 K is composed of atoms or molecules which are in random thermal motion and interact with each other. These atoms and molecules are composed of charged particles, e.g., protons and electrons, and kinetic interactions among these particles can generate coupled electrical and magnetic fields, resulting in energy emission in the form of electromagnetic waves or photons from the body surface. Examples of thermal radiation include the ultraviolet, visible and infrared light emitted by sun and the infrared radiation emitted by animals. Due to the significance of thermal radiation detection in numerous applications, various thermal radiation detection technologies have been developed, including the photovoltaic detectors, bolometers, pyroelectric detectors and thermoelectric detectors. Among these technologies, thermal radiation microsensors based on thermoelectric effects have been attracting great attentions in recent years due to their high stability, low cost for mass production, low power dissipation, wide working range, and the compatibility with microfabrication technology.

Conventional thermoelectric thermal radiation sensors generally consist of an absorbing plate (hot end) suspended by thermoelectric beams from the cold end. This type of design is called "planar design" because all the structures of the sensor are in the same plane and the heat flow direction is parallel to the plane. There are many disadvantage associated with the planar design. The fill factor of this type of design is very low, typically lower than 40%, because the thermoelectric legs take lots of space of the sensor area. Meanwhile, these planar microsensors are generally fabricated using photolithography techniques and the dimensions of each component are difficult to reduce below 1-2 microns. To suspend the thermal radiation absorption membrane, the thermopiles or the underlying supports must be thick enough to ensure the mechanical strength and their aspect ratios are normally small, which, however, limit the overall performance of thermoelectric thermal radiation sensors. Compared with other thermal radiation sensors such as bolometers and photovoltaic sensors whose responsivities are around 1000 V/W, planar thermoelectric thermal radiation sensors of a similar size are typically much less responsive (~200 V/W). Therefore, they usually have larger sensor sizes to increase the signal output. State-of-the-art thermoelectric sensors can have responsivities similar to that of a typical bolometer sensor but their dimensions are much larger. Large sensor size also causes a slow thermal response of the sensor. It is difficult to achieve a high performance while keeping the sensing unit miniaturized. Therefore, the conventional planar design is not suitable to apply in applications requiring high spatial resolution or fast response such as high-resolution thermal imaging. Thermoelectric sensors with a high responsivity, small size and short response time are required for the potential application of thermoelectric technology in high-resolution or high-speed thermal radiation detections.

The above-described background relating to thermal radiation sensing for various applications is merely intended to provide a contextual overview of thermal radiation technology, and is not intended to be exhaustive. Other context regarding thermal radiation and microsensors may become further apparent upon review of the following detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the purpose of this summary is to present some concepts related to some exemplary non-limiting embodiments in simplified form as a prelude to more detailed description of the various embodiments that follow in the disclosure.

Described herein are systems, methods, articles of manufacture, and other embodiments or implementations that can be of a thermoelectric thermal radiation microsensor. A thermal radiation microsensor can be implemented in connection with any type of device with a signal output related to thermal radiation, such as devices for night vision, thermal imaging, temperature detection, visible light imaging, human detector applications, etc.

According to one embodiment, described herein is a thermal radiation microsensor apparatus. The apparatus can comprise an insulating layer, a thermoelectric layer comprising free-standing pillars (connected in series) on the insulating layer, and a heat-generating layer. The apparatus can also comprise a metal layer connecting an n-type region to a p-type region, and a support layer for stabilizing the metal layer and heat-generating layer.

According to another embodiment, an apparatus can be fabricated comprising an insulating layer disposed on a substrate. A sensor array can connect sensor units, wherein the sensor units can comprise thermoelectric layer on the insulating layer, wherein the thermoelectric layer can comprise n-type and p-type pillars, a metal layer(s), a heat generating layer on the metal layer, and signal output electrodes for outputting pixel data.

According to yet another embodiment, described herein is a method for facilitating fabrication of a thermal radiation microsensor. The process comprises depositing a thermoelectric layer on an insulating layer and developing n-type and p-type pillars from an etching process. Thereafter, a sacrificial layer, support layers and a metal layer can be deposited prior to removing the sacrificial layer, resulting in a suspended structure.

These and other embodiments or implementations are described in more detail below with reference to the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of various embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in one or more embodiments.

A component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and/or "demonstrative" are used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

To increase the sensitivity while minimizing the sensing unit size, a new design of thermoelectric thermal radiation sensors based on vertical standing thermoelectric pillars is described here, in which multiple free-standing thermoelectric micro pillars can act as thermoelectric pairs as well as the mechanical support of a heat generating layer. Such a thermal radiation sensor can comprise a heat-generating layer, a free-standing thermoelectric pillar structure, of which n-type and p-type thermoelectric pillars are connected in series and a connection circuit for signal output. Radiation absorbed by the heat generating layer can generate a temperature difference between the heat generating layer and the substrate, which can drive the thermoelectric pairs comprising p-type and n-type thermoelectric micro pillars to output a voltage according to the Seebeck effects. The voltage is a measure of the thermal radiation absorbed. In contrast with the conventional planar configuration, in this design, heat flows along the vertical pillars and are perpendicular to the substrate. Multiple n-type and p-type thermoelectric pairs can be connected alternatively in series to improve the signal output.

Because thermoelectric pairs can stand vertically, their dimensions do not affect the fill factor of the device. The fill factor of this pillar design can be nearly one hundred percent without adding a second absorption layer or using other complex structures, leading to much reduced sensor size. Using micro pillars as the thermal radiation sensing structures can also achieve high responsivity while maintaining a small sensor size because the micro pillars can produce high thermal resistance due to their high aspect ratio, even though their lengths are small. Since the responsivity can be proportional to the height of the pillars, and inversely proportional to their cross section area, a high responsivity can be achieved by shrinking the diameter of the pillars or enlarging their height. By using pillars with large aspect ratio but a small diameter, the size of the sensor can be small. The free-standing pillar array design can also eliminate parasitic heat loss by any supporting layer and the alternatively connected n- and p-type pillars can boost the output signal. The diameters of the pillars can be below 1 micron to obtain a high responsivity as well as a short response time while minimizing the sensor size. It is expected that this new design can find potential applications in the areas related to thermal radiation or temperature sensing, especially those requiring a small sensor size and fast response, such as thermal imaging, night vision, and/or bio-sensing.

Figure 18:
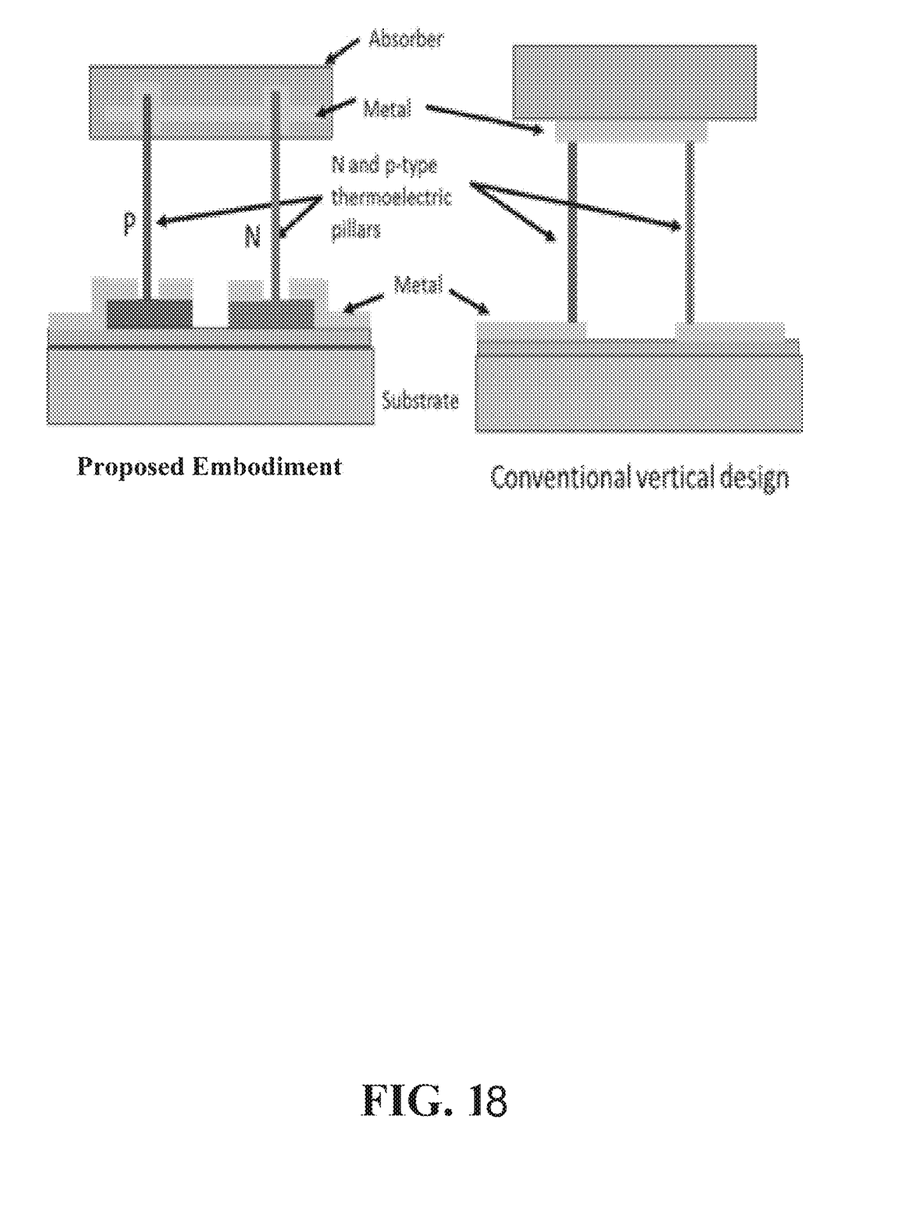
FIG. 18 illustrates an example schematic of a proposed embodiment of a thermal radiation microsensor in comparison to a conventional design.

In conventional macro scale vertical thermoelectric coolers or generators, thermoelectric elements of uniform shape and size are adopted and these elements are electrically connected at the top and bottom surfaces by metal layers deposited on insulating substrates. FIG. 18 represents a proposed embodiment of this disclosure relative to a conventional design. However, the conventional vertical configuration cannot be implemented in micro sensing devices with thermoelectric elements of a diameter smaller than 1 micron because of the huge contact resistance and incompatibility with conventional thin film deposition process. Thus a monolithically integrated pillar-base thermoelectric element structure can be adopted and metal connections can be made on the large top surface of the bases instead of underneath the element to reduce the contact resistance at the bottom. An insulator-metal structure or insulator-metal-insulator sandwich structure, within which the top tips of pillars can be embedded in the metal layer and connected by conformably coated metal patterns, can be adopted to enhance the top connections.

The thermal radiation sensing unit can comprise two or more pillars of different doping types that can be interconnected in series. The pillars can comprise multiple nanowires. Furthermore, a sensor array can comprise connected sensor units to enhance the signal output. The sensor units can be isolated to form a thermal imaging sensor, wherein each sensor unit can be a pixel of the imaging sensor. The sensor array can also comprise sensor unit groups, wherein the sensor unit groups (small pixels) are used to form large pixels to output different signals (i.e., color information of visible light on the large pixels).

Figure 7:
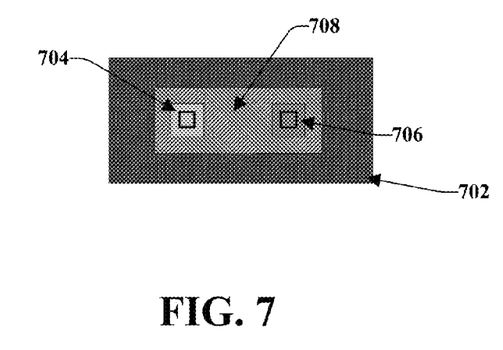

The sensor can be fabricated using the following fabrication process: First, an insulating layer and a thermoelectric layer can be deposited successively on the substrate or the insulating layer can be the substrate. Second, ion implantation is used to selectively dope the thermoelectric layer to form patterned n- and p-type regions. Third, photolithography fabrication method or other micro/nano patterning techniques (e.g., nanoimprint) are applied to define the micro pillar pattern with a predetermined size on the thermoelectric n- and p-type regions. Dry etching is then used to produce the pillars. The pillar diameter can range from 1 µm to 50 nm. The pillar size can be further reduced with other techniques. The bottom ends of the pillars can be monolithically integrated with a larger flat base through a partial etching to ensure good electric contact. After patterning the pillar structure, another etching step is applied to isolate the different pillars for further circuit connection. To fabricate the bottom electrical connection, a metal layer is deposited on the top surface of the bases and insulating layer surface and is patterned to form the bottom connection. To fabricate the circuit connection of the top layer electric connection, a sacrificial support layer is deposited, which can be a $SiO_2$ or polymer layer. A first support layer can be further deposited on the top the sacrificial layer if necessary. To fabricate the top electrical connection, the tips of the pillars are exposed (FIG. 7A) and then connected through metal deposition and patterning. A second support layer and a heat-generating layer are then deposited, which can be of the same material. The heat-generating layer can be adjusted for different sensing applications. At last, the sacrifice layer is removed to form the suspended sensing structure. The sensor units with the same or different heat-generating layers can be integrated into a patterned array to form a thermal imaging sensor or a multipurpose sensor.

As an overview of the various embodiments presented herein, to correct for the above-identified deficiencies and other drawbacks of thermal radiation microsensors, various embodiments are described herein to facilitate thermal radiation microsensor fabrication.

A simplified overview is provided herein to help enable a basic or general understanding of various aspects of exemplary, non-limiting embodiments that follow in the more detailed description and the accompanying drawings. This overview is not intended, however, as an extensive or exhaustive overview. Instead, the purpose of this overview is to present some concepts related to some exemplary non-limiting embodiments in simplified form as a prelude to more detailed descriptions of the various embodiments that follow in the disclosure.

FIGS. 1-11 illustrate apparatuses and methods that facilitate production of thermal radiation microsensors. For simplicity of explanation, the methods are depicted and described as a series of acts. It is to be understood and appreciated that the various embodiments are not limited by the acts illustrated and/or by the order of acts. For example, acts can occur in various orders and/or concurrently, and with other acts not presented or described herein. Furthermore, not all illustrated acts may be required to implement the methods. In addition, the methods could alternatively be represented as a series of interrelated states via a state diagram or events.

Figure 1:
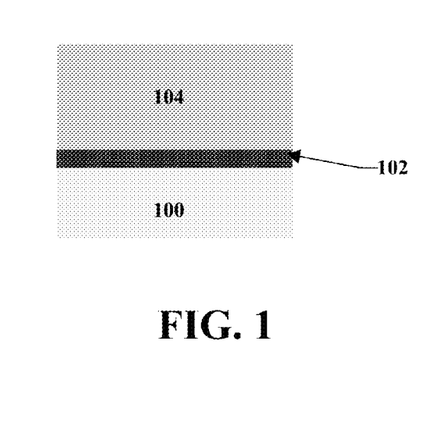
FIGS. 1, 2, & 3 illustrate an example schematic of a fabrication step for a thermal radiation microsensor comprising depositing an insulating layer and a thermoelectric layer, doping the thermoelectric layer, and photolithography.
Figure 2:
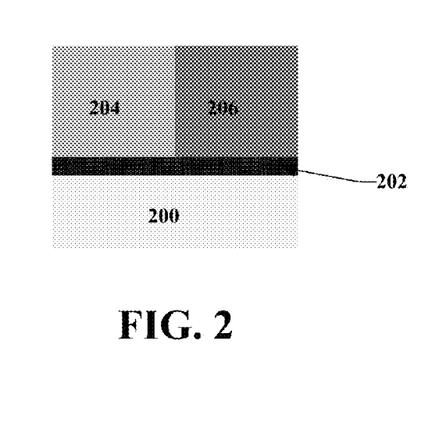
Figure 3:
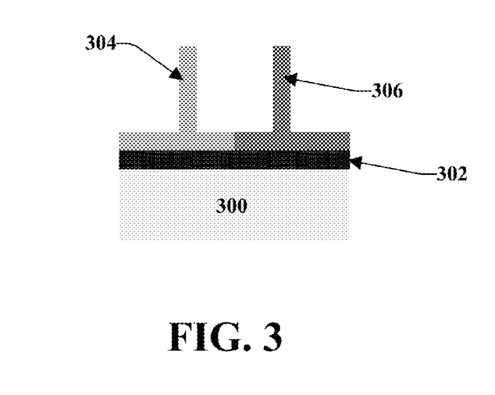

Referring now to FIGS. 1, 2, & 3, illustrated is an example schematic of a fabrication step for a thermal radiation microsensor comprising depositing an insulating layer and a thermoelectric layer, doping the thermoelectric layer, and photolithography. FIG. 1 illustrates a cross-section of an insulating layer 102 being deposited on a substrate 100. The insulating layer 102 can be a low stress nitride (LSN) layer 102. Thereafter, a thermoelectric layer 104 can be deposited onto the insulating layer 102.

FIG. 2 illustrates a cross-section of an insulating layer 202 being deposited on a substrate 200. The insulating layer 202 can be a LSN insulating layer 202. Ion implementation can be used to selectively dope the thermoelectric layer 104 to form a patterned n-type region 204 and a patterned p-type region 206.

FIG. 3 illustrates a cross-section of an insulating layer 302 being deposited on a substrate 300. The insulating layer 302 can be a LSN insulating layer 302. After the thermoelectric layer 104 is selectively doped, the patterned n-type region 204 and the patterned p-type region 206 can be defined as an n-type micro pillar 304 and a p-type micro pillar 306 via a photolithography fabrication method or other patterning methods. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be monolithically integrated with a larger flat base through partial etching to ensure an electric contact.

Figure 4:
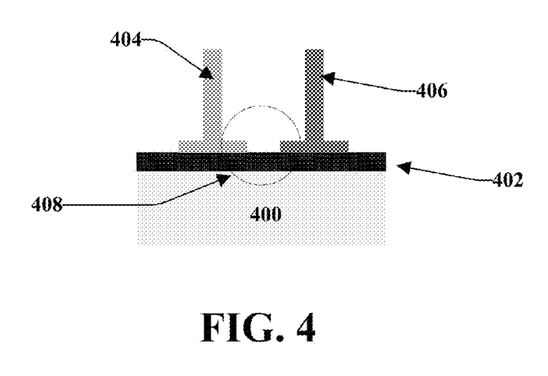
FIGS. 4, & 5 illustrate an example schematic of a side view and a top view of an etching step to isolate thermal radiation microsensor pillars.
Figure 5:
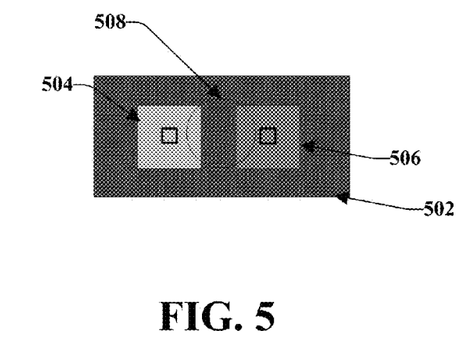

Referring now to FIGS. 4, & 5 illustrated is an example schematic of a side view and a top view of an etching step to isolate thermoelectric micro pillars. FIG. 4 illustrates a cross-section where an insulating layer 402 can be deposited on a substrate 400. The insulating layer 402 can be a LSN insulating layer 402. After the thermoelectric layer 104 is selectively doped, the patterned n-type region 204 and the patterned p-type region 206 can be defined as an n-type micro pillar 404 and a p-type micro pillar 406 via a photolithography fabrication method or other patterning methods. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be integrated with a larger flat base through partial etching to ensure an electric contact. Thereafter, another etching process can be performed to isolate 408 the base of the n-type micro pillar 404 from the base of the p-type micro pillar 406.

FIG. 5 illustrates a cross-section where an insulating layer 502 can be deposited on a substrate 400. The insulating layer 502 can be a LSN insulating layer 502. After the thermoelectric layer 104 is selectively doped, the patterned n-type region 204 and the patterned p-type region 206 can be defined as an n-type micro pillar 504 and a p-type micro pillar 506 via a photolithography fabrication method or other patterning methods. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be integrated with a larger flat base through partial etching to ensure an electric contact. Thereafter, another etching process can be performed to isolate 508 the base of the n-type micro pillar 504 from the base of the p-type micro pillar 506.

Figure 6:
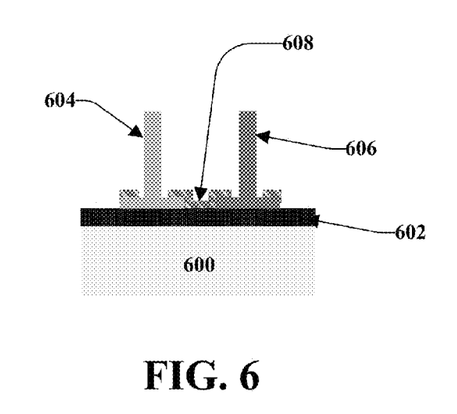
FIGS. 6, & 7 illustrate an example schematic of a side view and a top view of a metal layer deposition on the thermal radiation microsensor.

Referring now to FIGS. 6, & 7 illustrated is an example schematic of a side view and a top view of a metal layer deposition on the thermal radiation microsensor. FIG. 6 illustrates a cross-section where an insulating layer 602 can be deposited on a substrate 600. The insulating layer 602 can be a LSN insulating layer 602. After the thermoelectric layer 104 is selectively doped, the patterned n-type region 204 and the patterned p-type region 206 can be defined as an n-type micro pillar 604 and a p-type micro pillar 606 via a photolithography fabrication method and other patterning methods. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be integrated with a larger flat base through partial etching to ensure an electric contact. To fabricate an electrical connection, a metal layer 608 can be deposited and patterned on the base of the n-type micro pillar 604 and the base of the p-type micro pillar 606.

FIG. 7 illustrates a top view where an insulating layer 702 can be deposited on a substrate. The insulating layer 702 can be a LSN insulating layer 702. After the thermoelectric layer 104 is selectively doped, the patterned n-type region 204 and the patterned p-type region 206 can be defined as an n-type micro pillar 704 and a p-type micro pillar 606 via a photolithography fabrication method other patterning methods. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be monolithically integrated with a larger flat base through partial etching to ensure an electric contact. Another etching process can be performed to isolate the base of the n-type micro pillar 704 from the base of the p-type micro pillar 706. To fabricate an electrical connection, a metal layer 708 can be deposited and patterned on the base of the n-type micro pillar 704 and the base of the p-type micro pillar 706.

Figure 8:
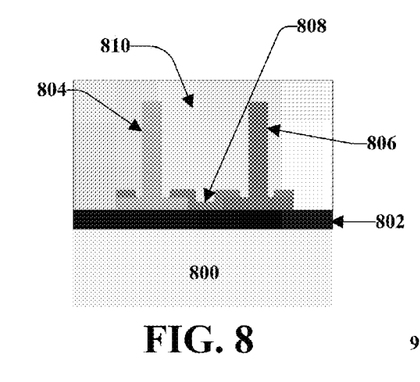
FIGS. 8, 9, & 10 illustrates an example schematic of a fabrication step for the thermal radiation microsensor comprising deposition of a sacrificial layer, exposing and connecting tips of the microsensor pillars, and depositing a support layer and heat generating layer, respectively.
Figure 9:
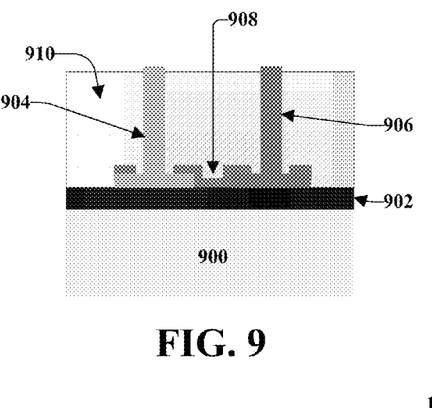
Figure 10:
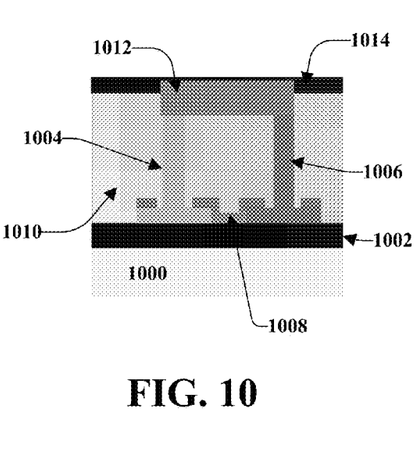

Referring now to FIGS. 8, 9, & 10 illustrated is an example schematic of a fabrication step for the thermal radiation microsensor comprising deposition of a sacrificial layer, exposing and connecting tips of the microsensor pillars, and depositing another support layer and heat generating layer, respectively.

FIG. 8 illustrates a cross-section view of a support layer deposition. An insulating layer 802 can be deposited on a substrate 800. The insulating layer 802 can be a LSN insulating layer 802. After the thermoelectric layer 104 is selectively doped, the patterned n-type region 204 and the patterned p-type region 206 can be defined as an n-type micro pillar 804 and a p-type micro pillar 806 via a photolithography fabrication method. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be integrated with a larger flat base through partial etching to ensure an electric contact. Another etching process can be performed to isolate the base of the n-type micro pillar 804 from the base of the p-type micro pillar 806. To fabricate an electrical connection, a metal layer 808 can be deposited and patterned on the base of the n-type micro pillar 804 and the base of the p-type micro pillar 806. Thereafter, a sacrificial layer 810 can be deposited on the insulating layer 802 to fabricate the electric connection between the tips of pillars 804 and 806. The sacrificial layer can comprise a silicon dioxide layer or polymer.

FIG. 9 illustrates a cross-section view of a support layer deposition. An insulating layer 902 can be deposited on a substrate 900. The insulating layer 902 can be a LSN insulating layer 902. After the thermoelectric layer 104 is selectively doped, the patterned n-type region 204 and the patterned p-type region 206 can be defined as an n-type micro pillar 904 and a p-type micro pillar 906 via a photolithography fabrication method. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be monolithically integrated with a larger flat base through partial etching to ensure an electric contact. Another etching process can be performed to isolate the base of the n-type micro pillar 904 from the base of the p-type micro pillar 906. To fabricate an electrical connection, a metal layer 908 can be deposited and patterned on the base of the n-type micro pillar 904 and the base of the p-type micro pillar 906. Additionally, a sacrificial layer 910 can be deposited on the insulating layer 902 to fabricate the electric connection between the tips of pillars 804 and 806. The sacrificial support layer can comprise a silicon dioxide layer or photoresist. A top of the n-type micro pillar 904 and another top of the p-type micro pillar 906 can be exposed to allow for the circuit connection of the top layer.

FIG. 10 illustrates a cross-section view of a metal layer deposition. An insulating layer 1002 can be deposited on a substrate 1000. The insulating layer 1002 can be a LSN insulating layer 1002. After the thermoelectric layer 104 is selectively doped, the patterned n-type region 204 and the patterned p-type region 206 can be defined as an n-type micro pillar 1004 and a p-type micro pillar 1006 via a photolithography fabrication method. An etching process can be used to fabricate the micro pillars to a predetermined size on the insulating layer. The etching process can be a wet or dry etching process. The micro pillar size can be further developed by leveraging other micro-fabrication techniques. The bottom ends of the pillars can be integrated with a larger flat base through partial etching to ensure an electric contact. Another etching process can be performed to isolate the base of the n-type micro pillar 1004 from the base of the p-type micro pillar 1006. To fabricate an electrical connection, a metal layer 908 can be deposited and patterned on the base of the n-type micro pillar 1004 and the base of the p-type micro pillar 1006. Additionally, a sacrificial support layer 1010 can be deposited on the insulating layer 1002 to fabricate the electric connection between the tips of pillars 804 and 806. The sacrificial support layer can comprise a silicon dioxide layer or polymer. A top tip of the n-type micro pillar 1004 and another top tip of the p-type micro pillar 1006 can be exposed to allow for the circuit connection of the top layer. To facilitate the electrical connection, a metal layer 1012 can be deposited and patterned on top of the exposed top tip of the n-type micro pillar 1004 and on top of the other exposed top tip of the p-type micro pillar. Thereafter, a support layer and a heat-generating layer 1014 can be deposited. The support layer and the heat-generating layer can be made of the same material.

Figure 11:
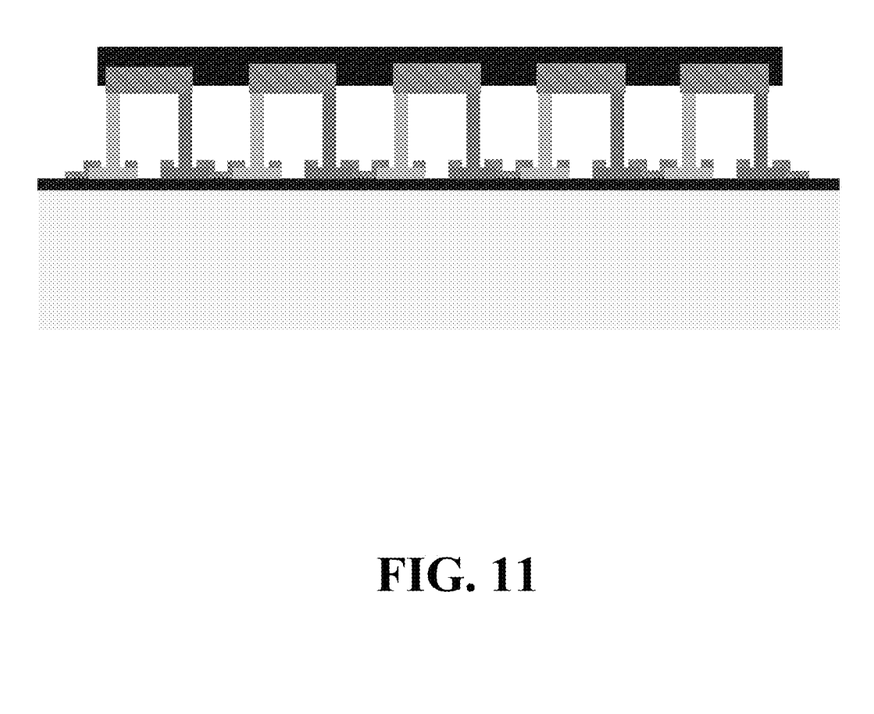
FIG. 11 illustrates an example schematic of a thermal radiation microsensor structure comprising multiple pillars after the sacrificial layer has been removed.

Referring now to FIG. 11 illustrated is an example schematic of a thermal radiation microsensor structure comprising multiple pillars (as produced by the processes as illustrated in FIGS. 1-10) in series after the support layer has been removed. It should be noted that the support layer and the heat generating layer can be the same layer. Additionally, the metal layer can be sandwiched by the support layer.

FIGS. 12-16 illustrate different implementations or embodiments of the thermal radiation microsensors. These implementations or embodiments comprise multiple components. It is to be understood and appreciated that the various embodiments are not limited by the structure components illustrated and/or by arrangement sequence of the components. For example, some components can be on the top instead of underneath of the other components and some components such as support layer and heat generating layer can be physically a single layer. Additional components can also be added to enhance the performance or for other applications.

Figure 12:
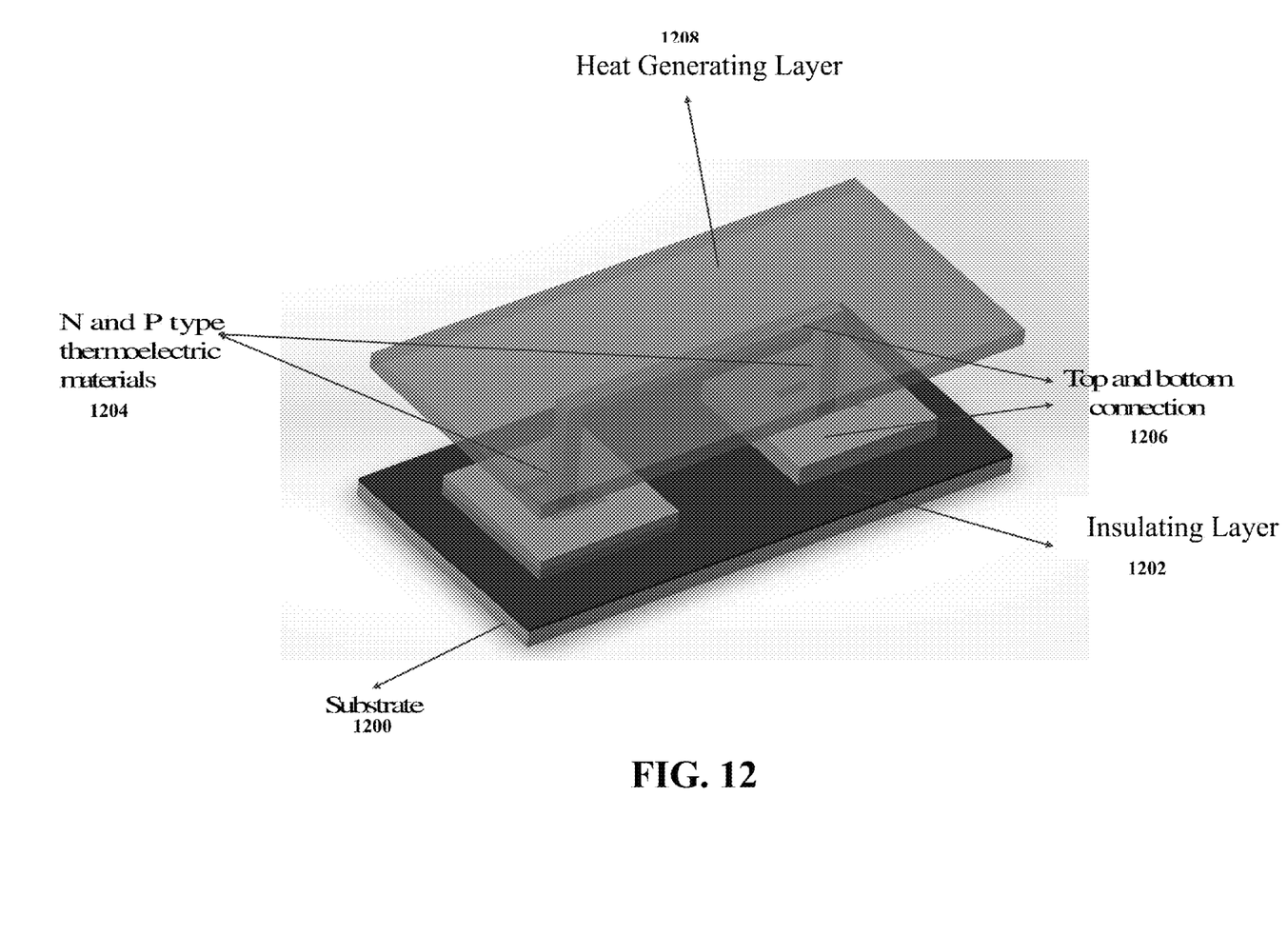
FIG. 12 illustrates an example schematic of a thermal radiation microsensor structure comprising two pillars of different types.

Referring now to FIG. 12 illustrated is an example schematic of a thermal radiation microsensor structure comprising two pillars. The current structure can comprise a substrate 1200 and an insulating layer 1202 deposited on the substrate 1200. N-type and p-type thermoelectric materials 1204 can be deposited and shaped into pillars comprising top and bottom connections 1206. Furthermore, a support layer and/or a heat-generating layer 1208 can be deposited on top of the top connections 1206 of the n-type and p-type thermoelectric materials 1204, wherein the pillars are embedded in the support layer and/or the heat-generating layer 1208.

Figure 13:
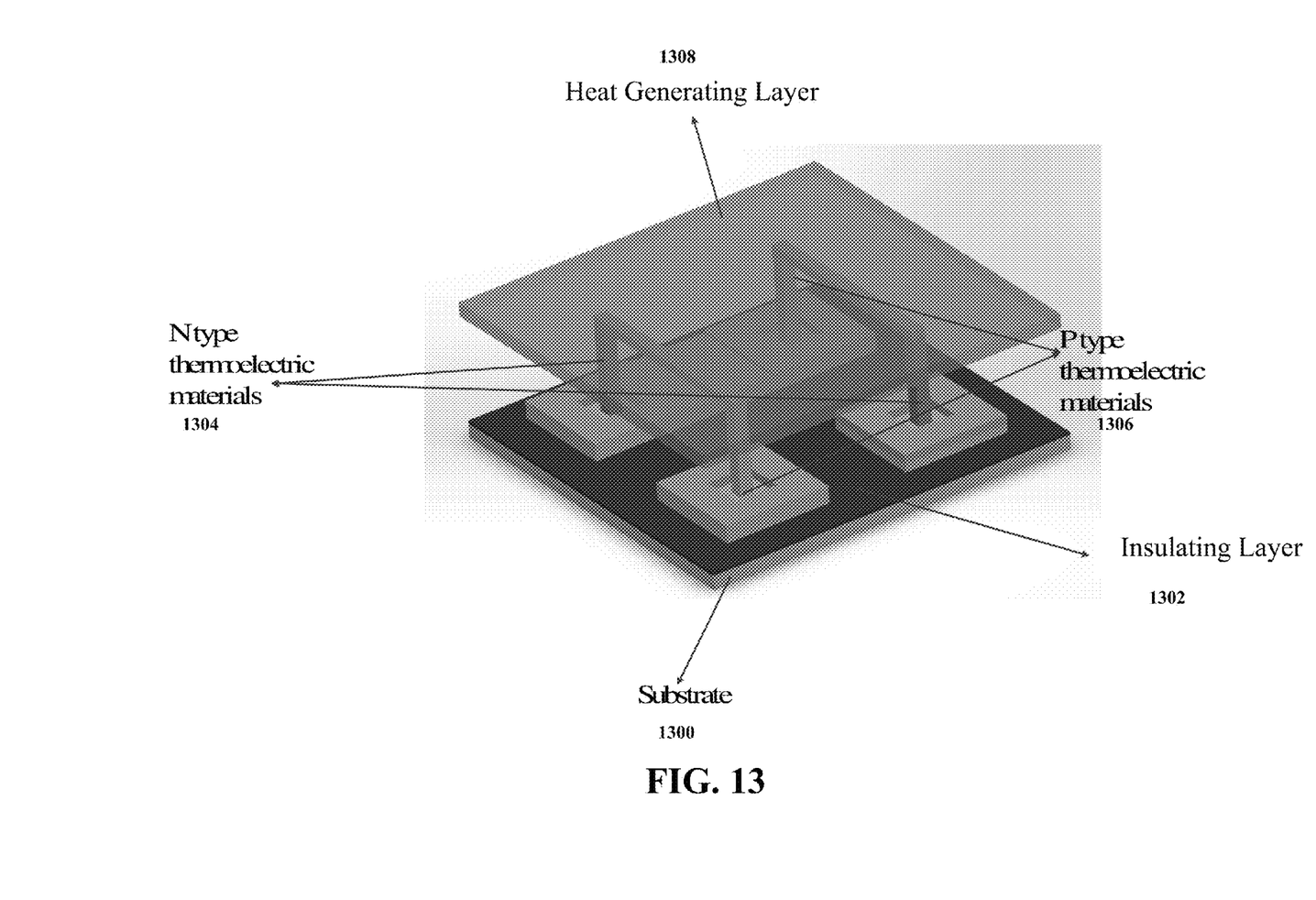
FIG. 13 illustrates an example schematic of a thermal radiation microsensor structure comprising multiple pillars connected in series.

Referring now to FIG. 13 illustrated is an example schematic of a thermal radiation microsensor structure comprising multiple pillars. The current structure can comprise a substrate 1300 and an insulating layer 1302 deposited on the substrate 1300. N-type and thermoelectric materials 1304 and p-type thermoelectric materials 1306 can be deposited on the insulating layer 1302 and shaped into pillars comprising top and bottom connections. The n-type and p-type pillars are electrically connected alternatively in series. Furthermore, a support layer and/or a heat generating layer 1308 can be deposited on top of the top connections of the n-type thermoelectric materials 1304 and p-type thermoelectric materials 1306, wherein the pillars are embedded in the support layer and/or the heat generating layer 1308.

Figure 14:
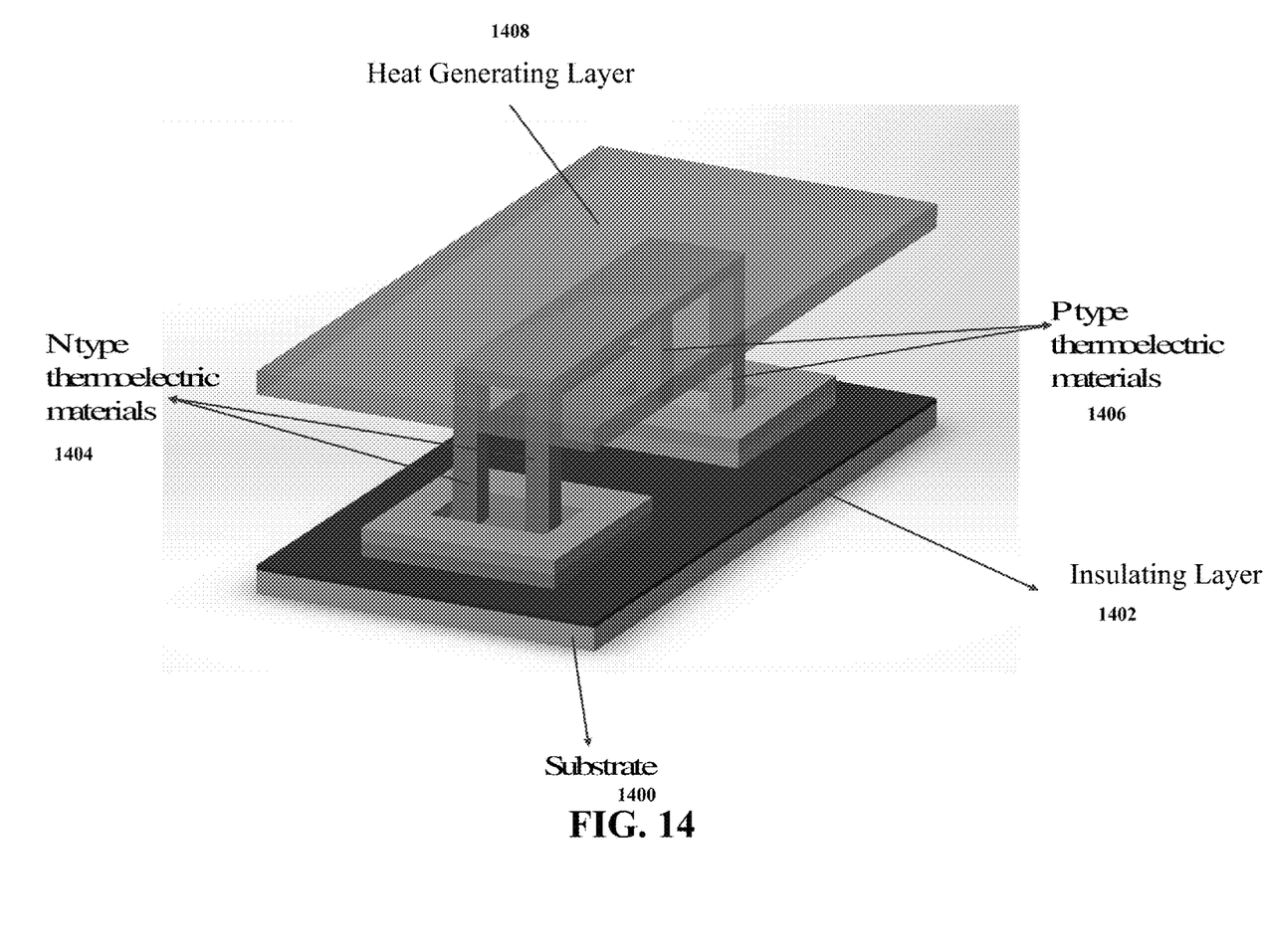
FIG. 14 illustrates an example schematic of a thermal radiation microsensor structure comprising pillars comprising multiple nanowires in parallel.

Referring now to FIG. 14 illustrated is an example schematic of a thermal radiation microsensor structure with pillars comprising multiple nanowires. The current structure is another embodiment that can comprise a substrate 1400 and an insulating layer 1402 deposited on the substrate 1400. N-type thermoelectric materials 1404 and p-type thermoelectric materials 1406 can be deposited on the insulating layer 1402 and shaped into pillars comprising top and bottom connections. Each pillar can comprise nanowires in parallel. The n-type and p-type pillars are electrically connected alternatively in series. Furthermore, a support layer and/or a heat generating layer 1408 can be deposited on top of the top connections of the n-type thermoelectric materials 1404 and p-type thermoelectric materials 1406, wherein the pillars are embedded in the support layer or the heat generating layer 1408. The support layer and the heat generating layer can be of the same material.

Figure 15:
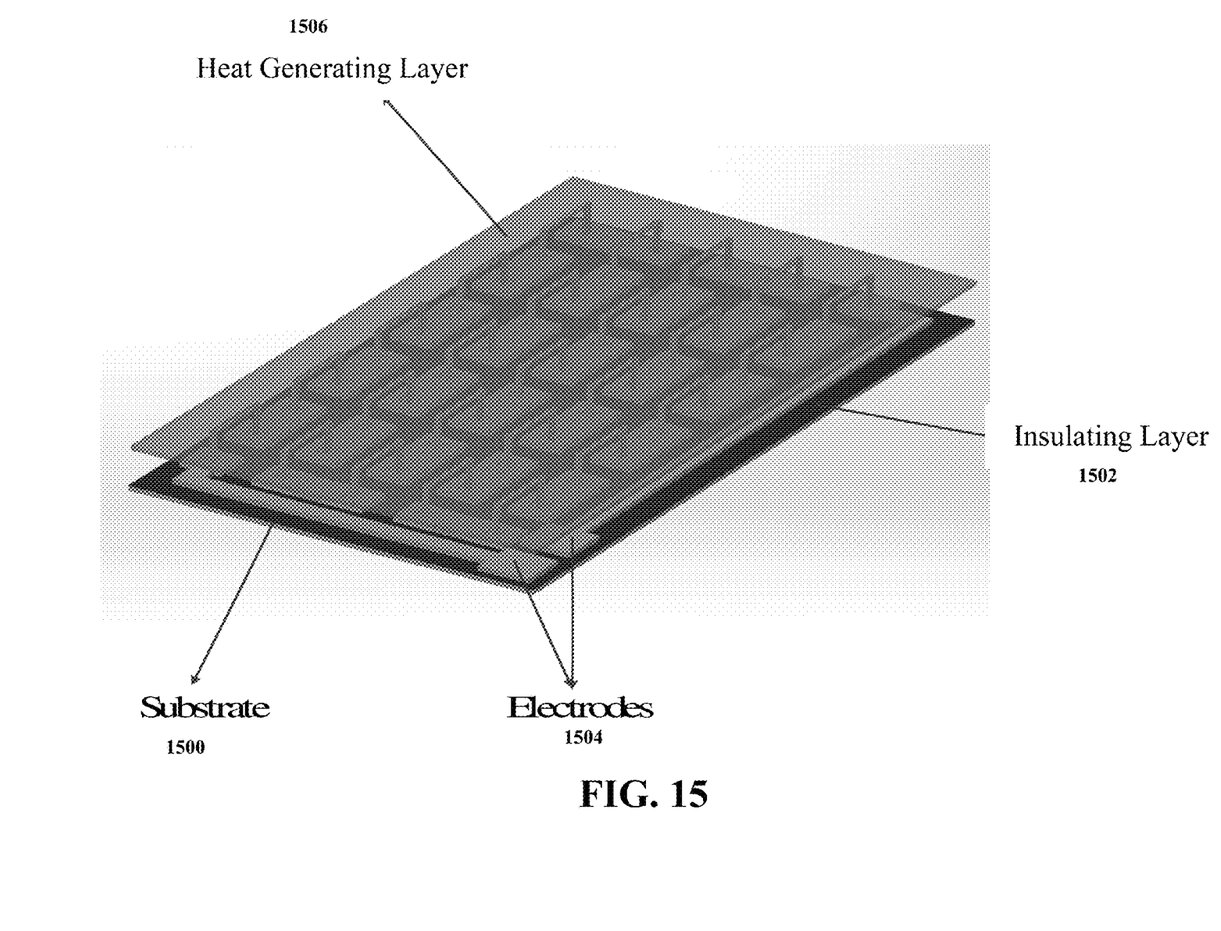
FIG. 15 illustrates an example schematic of a thermal radiation microsensor array in which the microsensor units are connected to provide desired output.

Referring now to FIG. 15 illustrated is an example schematic of a thermal radiation microsensor array in which the microsensor units are connected to enhance output. The current structure is yet another embodiment that can comprise a substrate 1500 and an insulating layer 1502 deposited on the substrate 1500. N-type and thermoelectric materials and p-type thermoelectric materials can be deposited on the insulating layer 1502 and shaped into pillars comprising top and bottom connections to fabricate multiple sensors. The sensors can be connected in series and the bottom connections can be connected to electrodes 1504. Furthermore, a support layer and/or a heat generating layer 1506 can be deposited on top of the top connections of the n-type thermoelectric materials and the p-type thermoelectric materials, wherein the pillars are embedded in the support layer or heat generating layer 1506. The support layer and the heat generating layer can be of the same material.

Figure 16:
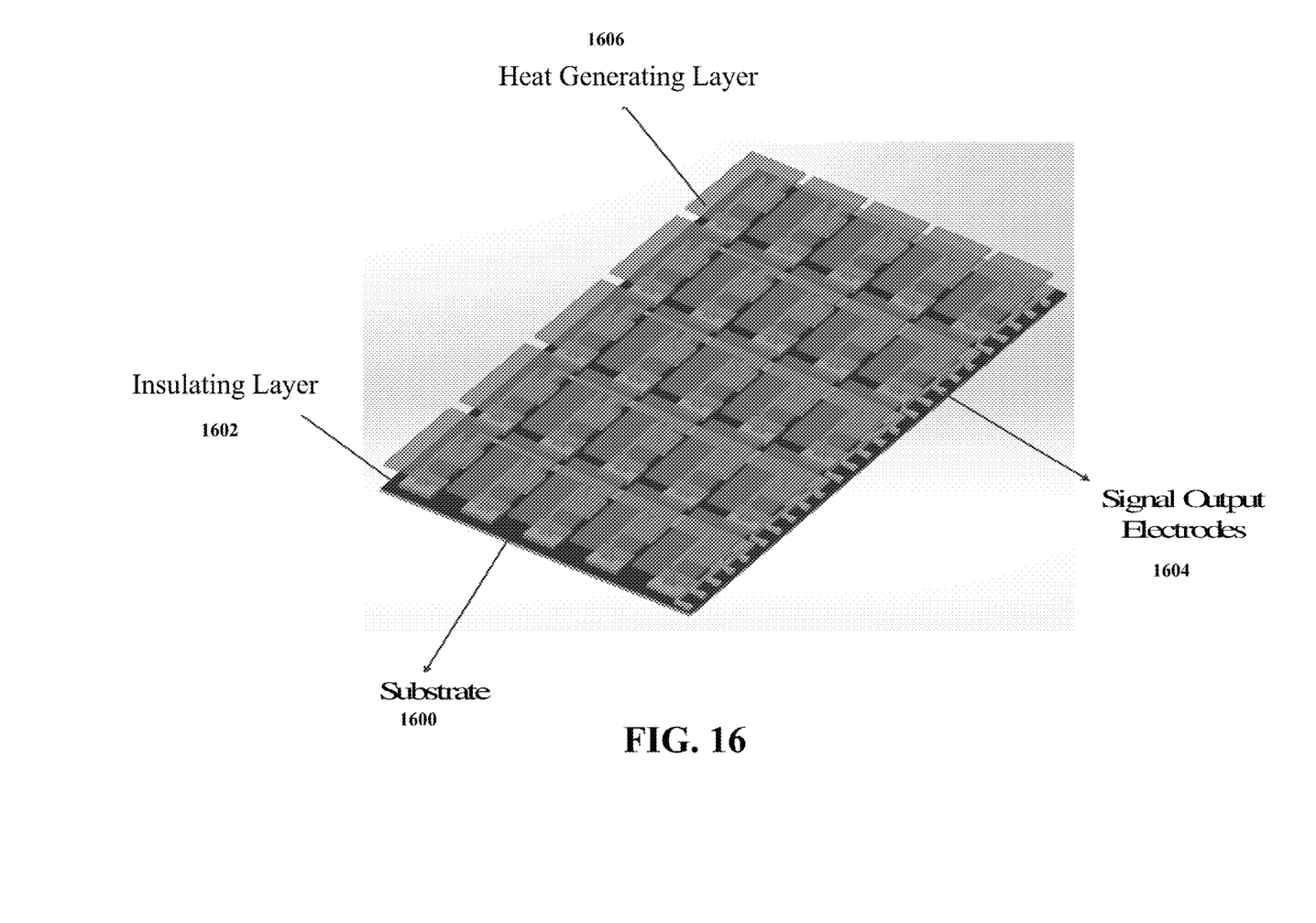
FIG. 16 illustrates an example schematic of a thermal radiation microsensor array in which the separated microsensor units are arrayed to form a thermal imaging sensor.

Referring now to FIG. 16 illustrated is an example schematic of a thermal radiation microsensor array in which the microsensor units are isolated to form a thermal imaging sensor. Each microsensor unit can be a pixel on the imaging sensor. The current structure is yet another embodiment that can comprise a substrate 1600 and an insulating layer 1602 deposited on the substrate 1600. N-type and thermoelectric materials and p-type thermoelectric materials can be deposited on the insulating layer 1602 and shaped into pillars comprising top and bottom connections to fabricate multiple sensors. The n-type and p-type pillars of each microsensor unit are electrically connected alternatively in series. Furthermore, a support layer and/or heat generating layer 1606 can be deposited on top of the top connections of the n-type thermoelectric materials and the p-type thermoelectric materials in each sensor unit, wherein the pillars are embedded in the support layer and/or the heat generating layer 1606. The microsensor array structure can comprise several sensor unit groups (small pixels), which can comprise isolated sensor units and can be used to form a large effective pixel to output various signals (e.g., the color information of the thermal radiation).

Figure 17:
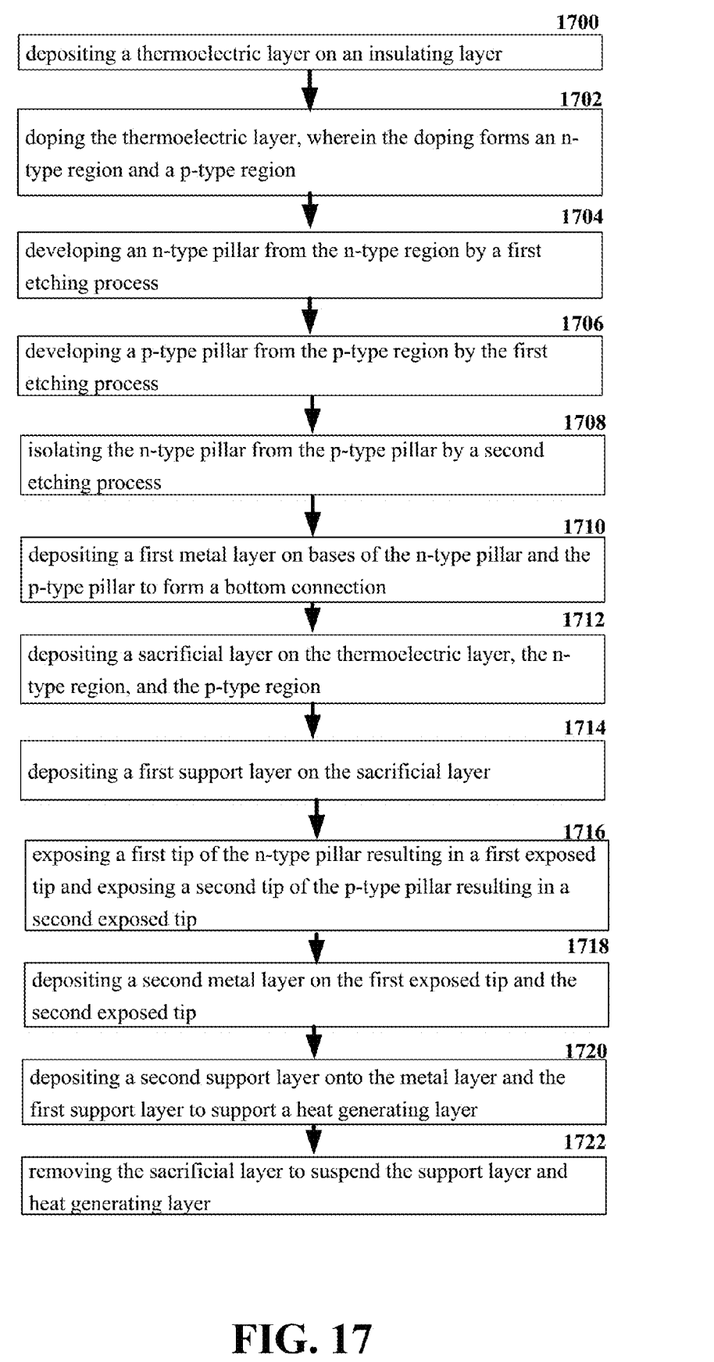
FIG. 17 illustrates an example schematic system block diagram of a method for fabricating the thermal radiation microsensor.

Referring now to FIG. 17 illustrated is an example schematic system block diagram of a method for fabricating the thermal radiation micro-sensor. At element 1700, a thermoelectric layer can be deposited on the insulating layer. Thereafter, the thermoelectric layer can be doped at element 1702, wherein the doping comprises an implantation of ions and forms an n-type region and a p-type region. An n-type pillar can be developed from the n-type region by a first etching process at element 1704, and a p-type pillar can be developed from the p-type region by the first etching process at element 1706. Consequently, at element 1708, the n-type pillar can be isolated from the p-type pillar by a second etching process prior to depositing a first support layer on the thermoelectric layer, the n-type region, and the p-type region at element 1710. At element 1712, a first metal layer can be deposited on bases of the n-type pillar to form a bottom connection prior to depositing a sacrificial layer on the thermoelectric layer, the n-type region, and the p-type region at element 1714. Thereafter, a first support layer can be deposited on the sacrificial layer at element 1716. At element 1718, a first tip of the n-type pillar can be exposed resulting in a first exposed tip and exposing a second tip of the p-type pillar resulting in a second exposed tip. Additionally, a second metal layer can be deposited on the first exposed tip and the second exposed tip at element 1720, and a second support layer can be deposited onto the metal layer and the first support layer to support a heat generating layer at element 1720. Furthermore, the sacrificial layer can be removed to suspend the support layer and the heat generating layer at element 1722.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:
1. A thermal radiation sensor apparatus, comprising:
an insulating layer disposed on a substrate;
a thermoelectric layer on the insulating layer, wherein the thermoelectric layer comprises:
vertical free-standing n-type pillars formed from an n-type region, and
vertical free-standing p-type pillars formed from a p-type region, wherein each pillar is monolithically integrated with a flat base, and wherein the vertical free-standing n-type pillars are not in contact with the vertical free-standing p-type pillars;
a first metal layer connecting first tops of the vertical free-standing n-type pillars to second tops of the vertical free-standing p-type pillars;
a second metal layer connecting first bottom bases of the vertical free-standing n-type pillars to second bottom bases of the vertical free-standing p-type pillars, wherein the first bottom bases are wider than the vertical free-standing n-type pillars and the second bottom bases are wider than the vertical free-standing p-type pillars;
a support layer, wherein the support layer stabilizes the first metal layer and the first tops and the second tops, and wherein the support layer is not in contact with the first bottom bases or the second bottom bases; and
a heat generating layer, wherein the heat generating layer generates heat when being exposed to thermal radiation.

2. The thermal radiation sensor apparatus of claim 1, wherein the vertical free-standing n-type pillars and the vertically standing p-types pillars are formed by an etching process.

3. The thermal radiation sensor apparatus of claim 1, wherein the second metal layer is deposited on top of the first bottom bases and the second bottom bases.

4. The thermal radiation sensor apparatus of claim 1, wherein the vertical free-standing n-type pillars and the vertical free-standing p-type pillars are electrically connected alternatively in series.

5. The thermal radiation sensor apparatus of claim 1, wherein the heat generating layer is on top of the support layer.

6. The thermal radiation sensor apparatus of claim 1, wherein the heat generating layer and the support layer comprise a same material.

7. A thermal radiation sensor apparatus, comprising:
an insulating layer disposed on a substrate;
a sensor array comprising sensor units, wherein the sensor units comprise:
a thermoelectric layer on the insulating layer, wherein the thermoelectric layer comprises:
n-type pillars formed from an n-type region, wherein the n-type pillars are vertical free-standing n-type pillars, and
p-type pillars formed from a p-type region, wherein the p-type pillars are vertical free-standing p-type pillars, and wherein the n-type pillars and the p-type pillars are monolithically integrated with a flat base;
a first metal layer enclosing first top tips of the n-type pillars and second top tips of p-type pillars;
a second metal layer connecting the first bottom bases of n-type pillars to second bottom bases of p-type pillars, wherein the first bottom bases are larger than the vertical free-standing n-type pillars and the second bottom bases are larger than the vertical free-standing p-type pillars;

a support layer, wherein the support layer stabilizes the first metal layer, and wherein the support layer is not in contact with the first bottom bases or the second bottom bases;
a heat generating layer, wherein the heat generating layer generates heat when exposed to thermal radiation; and
signal output electrodes for outputting pixel data.

8. The thermal radiation sensor apparatus of claim 7, wherein the vertical free-standing n-type pillars and the vertical free-standing p-type pillars are electrically connected in series.

9. The thermal radiation sensor apparatus of claim 7, wherein the first metal layer electrically connects the first top tips of the n-type pillars to the second top tips of the p-type pillars.

10. The thermal radiation sensor apparatus of claim 7, wherein the heat generating layer is on top of the support layer.

11. The thermal radiation sensor apparatus of claim 7, wherein the heat generating layer and the support layer comprise a same material.

12. The thermal radiation sensor apparatus of claim 7, wherein the support layer stabilizes the heat generating layer.

13. A thermal radiation sensor apparatus, comprising:
an insulating layer disposed on a substrate;
a sensor array comprising sensor units, wherein the sensor units comprise:
  a thermoelectric layer on the insulating layer, wherein the thermoelectric layer comprises:
    vertical free-standing n-type pillars formed from an n-type region, and
    vertical free-standing p-type pillars formed from a p-type region, wherein the vertical free-standing n-type pillars and the vertical free-standing p-type pillars are monolithically integrated with a flat base;
  a first metal layer connecting first top tips of the vertical free-standing n-type pillars to second top tips of the vertical free-standing p-type pillars;
  a second metal layer connecting the first bottom bases of vertical free-standing n-type pillars to second bottom bases of the vertical free-standing p-type pillars, wherein the first bottom bases are wider than the vertical free-standing n-type pillars and the second bottom bases are wider than the vertical free-standing p-type pillars;
  a heat generating layer, wherein the heat generating layer absorbs thermal radiation, and wherein the heat generating layer converts the thermal radiation to heat; and
  a support layer, wherein the support layer stabilizes the first metal layer and the heat generating layer, and wherein the support layer is not in contact with the first bottom bases or the second bottom bases.

14. The thermal radiation sensor apparatus of claim 13, wherein the n-type region is a patterned region.

15. The thermal radiation sensor apparatus of claim 13, wherein the p-type region is a patterned region.

16. The thermal radiation sensor apparatus of claim 13, wherein a first base of a first bottom end of the vertical free-standing n-type pillars is integrated with a second base of a second bottom end of the vertical free-standing p-type pillars.

17. The thermal radiation sensor apparatus of claim 13, wherein the first metal layer and the second metal layer are patterned metal layers.

18. The thermal radiation sensor apparatus of claim 13, wherein the sensor array further comprises a sacrificial layer comprising silicon dioxide.

19. The thermal radiation sensor apparatus of claim 13, wherein the sensor array further comprises a sacrificial layer comprising a polymer.

20. The thermal radiation sensor apparatus of claim 13, wherein the support layer is below the heat generating layer.

21. The thermal radiation sensor apparatus of claim 13, wherein the sensor array comprises a signal output electrode for outputting pixel data.

22. The thermal radiation sensor apparatus of claim 13, wherein the vertical free-standing n-type pillars and the vertical free-standing p-type pillars are formed by a partial etching process.

23. The thermal radiation sensor apparatus of claim 13, wherein the second metal layer is on top of the first bottom bases.

* * * * *